（12) United States Patent
Imamura

(10) Patent No.: US 9,306,529 B2
(45) Date of Patent: Apr. 5, 2016

(54) RESONATOR AND BAND PASS FILTER

(71) Applicant: Murata Manufacturing Co., Ltd., Nagaokakyo-shi, Kyoto-fu (JP)

(72) Inventor: Mitsutoshi Imamura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/795,945

(22) Filed: Jul. 10, 2015

(65) Prior Publication Data

US 2015/0318593 A1 Nov. 5, 2015

Related U.S. Application Data

(63) Continuation of application No. PCT/JP2013/076971, filed on Oct. 3, 2013.

(30) Foreign Application Priority Data

Jan. 15, 2013 (JP) ................................. 2013-004532

(51) Int. Cl.
*H03H 7/09* (2006.01)
*H03H 7/01* (2006.01)
*H03H 1/00* (2006.01)

(52) U.S. Cl.
CPC ............. *H03H 7/0115* (2013.01); *H03H 7/09* (2013.01); *H03H 7/1708* (2013.01); *H03H 7/1775* (2013.01); *H03H 2001/0085* (2013.01)

(58) Field of Classification Search
CPC ................. H03H 2001/0085; H03H 7/0115; H03H 7/09; H03H 7/1775; H03H 7/1708
USPC ........................................ 333/168, 175, 185
See application file for complete search history.

(56) References Cited

U.S. PATENT DOCUMENTS 3,718,874 A * 2/1973 Cooper, Jr. ........... H03H 7/0161
333/204
2007/0241839 A1 10/2007 Taniguchi
(Continued)

FOREIGN PATENT DOCUMENTS

JP 2003-045723 A 2/2003
WO 2007/119356 A1 10/2007
(Continued)

OTHER PUBLICATIONS

Official Communication issued in International Patent Application No. PCT/JP2013/076971, mailed on Jan. 14, 2014.

*Primary Examiner* — Benny Lee
*Assistant Examiner* — Rakesh Patel
(74) *Attorney, Agent, or Firm* — Keating & Bennett, LLP

(57) ABSTRACT

A resonator includes a multilayer body including a plurality of dielectric layers. An electrode is disposed on each of the plurality of dielectric layers. The resonator includes ground electrodes disposed on any of the dielectric layers, capacitor electrodes disposed on any of the dielectric layers, and inductor electrodes. The inductor electrodes are located in portions which start from nodes between the inductor electrodes and the capacitor electrodes as start points, pass through line electrodes disposed on dielectric layers different from the dielectric layers on which the capacitor electrodes are disposed and the dielectric layers on which the ground electrodes are disposed, and reach nodes between the inductor electrodes and the ground electrode as end points. The line electrode have a ring-shaped configuration, as viewed in a stacking direction of the dielectric layers.

12 Claims, 8 Drawing Sheets

(56) References Cited

U.S. PATENT DOCUMENTS

2010/0171568 A1 7/2010 Taniguchi
2011/0169586 A1 7/2011 Taniguchi
2013/0249646 A1* 9/2013 Mizoguchi ............... H03H 7/09
                                                      333/185

FOREIGN PATENT DOCUMENTS

| WO | 2009/041294 A1 | 4/2009 |
| WO | 2010/055725 A1 | 5/2010 |

* cited by examiner

FIG. 6A
FIG. 6B
FIG. 6C
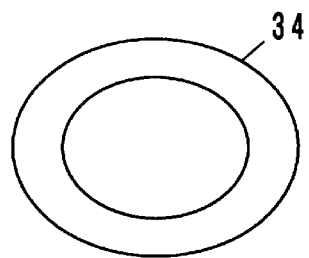
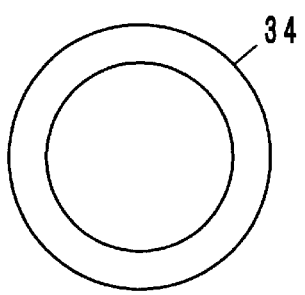
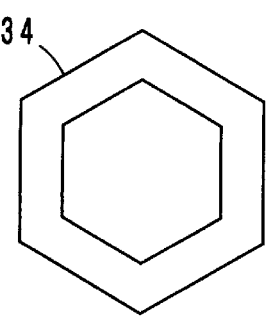

RESONATOR AND BAND PASS FILTER

BACKGROUND OF THE INVENTION

1. Field of the Invention

The present invention relates to a resonator including an inductor and a capacitor and to a band pass filter including this resonator.

2. Description of the Related Art

Hitherto, as a band pass filter including a plurality of resonators, the band pass filter disclosed in International Publication No. 2009/41294 is known. An example of this filter is shown in FIG. 9. In this filter, a capacitor is formed by a ground electrode 109 disposed on a dielectric layer 101 and capacitor electrodes 111 through 113 disposed on a dielectric layer 102. A plurality of inductor electrodes are formed by via-electrodes 131 through 136 and line electrodes 116 through 118. Loop surfaces of these inductor electrodes overlap each other, as viewed in a stacking direction of the dielectric layers. These inductor electrodes and the capacitors form LC parallel resonators. The line electrode 117 which overlaps the line electrodes 116 and 118 is formed in a meander line shape.

By forming the line electrode 117 in a meander line shape, the line length of the line electrode 117 can be relatively increased within a limited exclusive area, so that the inductance can be set to be a desired value. However, it has been found that a sufficient Q factor of the resonator is not obtained if the line electrode 117 is formed in a meander line shape. That is, in the line electrode 117 formed in a meander line shape, the concentration of a current in areas indicated by the hatched portions in FIG. 5C is observed, which causes a decrease in the Q factor.

SUMMARY OF THE INVENTION

Preferred embodiments of the present invention provide a resonator having a high Q factor and a band pass filter exhibiting high attenuation characteristics in and near a pass band.

A resonator according to a first aspect of various preferred embodiments of the present invention includes a multilayer body including a plurality of dielectric layers, an electrode being disposed on each of the plurality of dielectric layers; a ground electrode disposed on one of the dielectric layers; a capacitor electrode disposed on one of the dielectric layers; and an inductor electrode provided in a portion which starts from a node between the inductor electrode and the capacitor electrode as a start point, passes through a line electrode disposed on a dielectric layer different from the dielectric layer on which the capacitor electrode is disposed and the dielectric layer on which the ground electrode is disposed, and reaches a node between the inductor electrode and the ground electrode as an end point. The line electrode preferably has a ring-shaped configuration, as viewed in a stacking direction of the dielectric layers.

A band pass filter according to a second aspect of various preferred embodiments of the present invention includes a plurality of resonators. Each of the resonators is the above-described resonator.

In the above-described resonator, the line electrode defining the inductor electrode preferably has a ring-shaped configuration, as viewed from above. Accordingly, a flowing current is not locally concentrated, and as a result, the Q factor is improved. Because of the improved Q factor, the attenuation characteristics in and near the pass band of the band pass filter are improved.

According to various preferred embodiments of the present invention, the Q factor of a resonator is improved, and the attenuation characteristics in and near a pass band of a band pass filter are improved.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 6A, 6B and 6C are plan views illustrating other configurations of line electrodes.

DETAILED DESCRIPTION OF THE PREFERRED EMBODIMENTS

Figure 1:
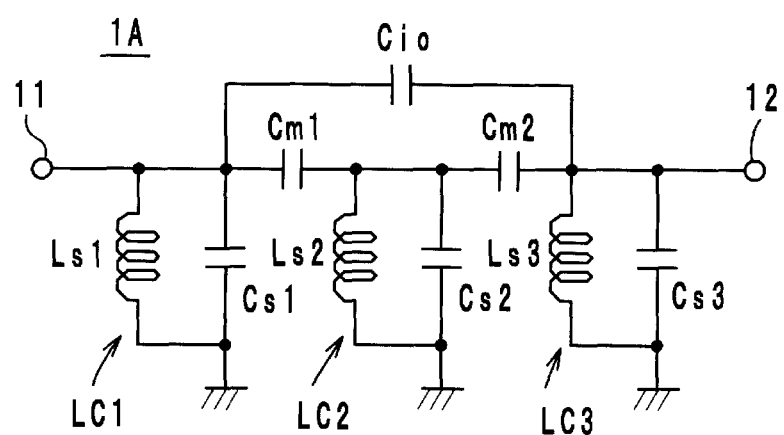
FIG. 1 is an equivalent circuit diagram illustrating a band pass filter according to a first preferred embodiment of the present invention.

Preferred embodiments of a resonator and a band pass filter according to the present invention will be described below with reference to the accompanying drawings. In the individual drawings, the same elements or the same portions are designated by like reference numerals, and an explanation of the same element or the same portion will be given only once.

A band pass filter 1A of a first preferred embodiment of the present invention has an equivalent circuit shown in FIG. 1. That is, the band pass filter 1A includes three LC parallel resonators LC1, LC2, and LC3. The LC parallel resonator LC1 preferably includes an inductor Ls1 and a capacitor Cs1. The LC parallel resonator LC2 preferably includes an inductor Ls2 and a capacitor Cs2. The LC parallel resonator LC3 preferably includes an inductor Ls3 and a capacitor Cs3.

One end of the LC parallel resonator LC1 is connected to an input electrode 11, and the other end thereof is connected to a ground. One end of the LC parallel resonator LC3 is connected to an output electrode 12, and the other end thereof is connected to a ground. One end of the LC parallel resonator LC2 is connected to the LC parallel resonator LC1 via a coupling capacitor Cm1 and is connected to the LC parallel resonator LC3 via a coupling capacitor Cm2. The other end of the LC parallel resonator LC2 is connected to a ground. A coupling capacitor Cio is connected between the input electrode 11 and the output electrode 12.

Figure 2:
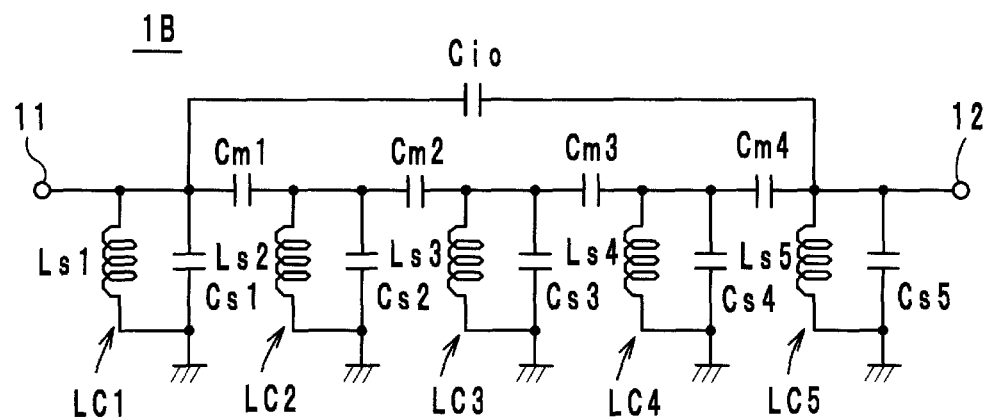
FIG. 2 is an equivalent circuit diagram illustrating a band pass filter according to a second preferred embodiment of the present invention.

A band pass filter 1B of a second preferred embodiment of the present invention has an equivalent circuit shown in FIG. 2. This filter 1B includes five LC parallel resonators LC1 through LC5. The basic configuration of the band pass filter 1B is similar to that of the band pass filter 1A of the first preferred embodiment.

Figure 3:
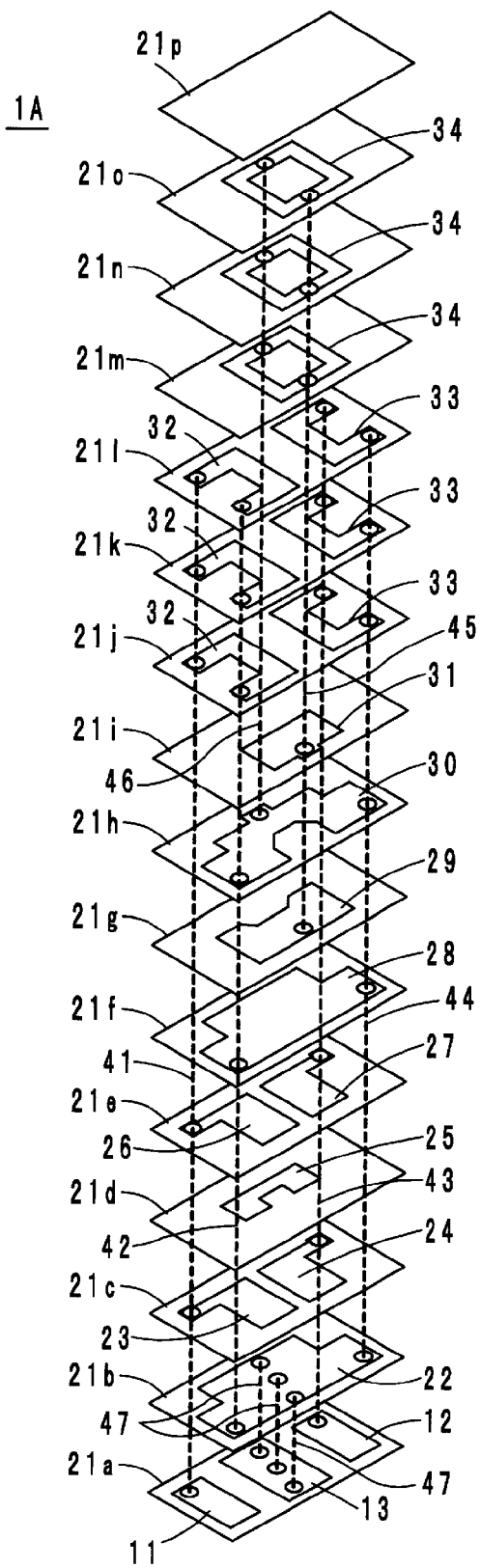
FIG. 3 is an exploded perspective view illustrating a first example of the multilayer structure of the band pass filter of the first preferred embodiment of the present invention.

A first example of the multilayer structure of the band pass filter 1A of the first preferred embodiment is shown in FIG. 3. This filter 1A is formed preferably by stacking a plurality of dielectric layers 21a through 21p on which electrodes are disposed. The dielectric layers 21a through 21p are made of, for example, low-temperature co-fired ceramic, and the various electrodes are formed by, for example, the application of a conductive paste.

The first example of the multilayer structure will be discussed more specifically. On the back side (opposite the side which faces the dielectric layer 21b) of the bottommost dielectric layer 21a, the input electrode 11, the output electrode 12, and a ground electrode 13 are provided. On the dielectric layer 21b, a ground electrode 22 is provided. On the dielectric layer 21c, capacitor electrodes 23 and 24 are provided. On the dielectric layer 21d, a capacitor electrode 25 is provided. On the dielectric layer 21e, capacitor electrodes 26 and 27 are provided. On the dielectric layer 21f, a ground electrode 28 is provided. On the dielectric layer 21g, a capacitor electrode 29 is provided. On the dielectric layer 21h, a ground electrode 30 is provided. On the dielectric layer 21i, a capacitor electrode 31 is provided. On each of the dielectric layers 21j, 21k, and 21l, line electrodes 32 and 33 are provided. On each of the dielectric layers 21m, 21n, and 21o, a line electrode 34 is provided. The topmost dielectric layer 21p does not contain an electrode.

In the dielectric layers 21a through 21o, among via-electrodes 41 through 46, necessary via-electrodes are provided. By stacking and sintering the dielectric layers 21a through 21p, the electrodes are connected to each other between the layers in the following manner.

The structure shown in FIG. 3 will now be discussed by referring to the equivalent circuit shown in FIG. 1. The capacitor Cs1 is preferably defined by the ground electrodes 22 and 28 and the capacitor electrodes 23 and 26 and the ground electrode 22 and the input electrode 11. The capacitor electrode 23 is connected to the input electrode 11 by the via-electrode 41. The plurality of line electrodes 32 are connected in parallel with each other by the via-electrodes 41 and 42 so as to define the inductor Ls1. The inductor Ls1 preferably is a line starting from the node between the via-electrode 41 and the capacitor electrode 26 as a start point, passing through the line electrodes 32, and reaching the node between the via-electrode 42 and the ground electrode 30 as an end point.

The capacitor Cs3 is preferably defined by the ground electrodes 22 and 28 and the capacitor electrodes 24 and 27 and the ground electrode 22 and the output electrode 12. The capacitor electrode 24 is connected to the output electrode 12 by the via-electrode 43. The plurality of line electrodes 33 are connected in parallel with each other by the via-electrodes 43 and 44 so as to define the inductor Ls3. This inductor Ls3 preferably is a line starting from the node between the via-electrode 43 and the capacitor electrode 27 as a start point, passing through the line electrodes 33, and reaching the node between the via-electrode 44 and the ground electrode 30 as an end point.

The capacitor Cs2 preferably is defined by the ground electrodes 28 and 30 and the capacitor electrodes 29 and 31. The plurality of line electrodes 34 are connected in parallel with each other by the via-electrodes 45 and 46 so as to define the inductor Ls2. This inductor Ls2 preferably is a line starting from the node between the via-electrode 45 and the capacitor electrode 31 as a start point, passing through the line electrodes 34, and reaching the node between the via-electrode 46 and the ground electrode 30 as an end point.

The capacitor Cm1 is provided between the line electrodes 32 and 34, and the capacitor Cm2 is provided between the line electrodes 33 and 34. The capacitor Cio is provided between the capacitor electrodes 23 and 25, the capacitor electrodes 24 and 25, the capacitor electrodes 26 and 25, and the capacitor electrodes 27 and 25. More specifically, the capacitance between the capacitor electrodes 23 and 25 and the capacitance between the capacitor electrodes 26 and 25 define a parallel capacitance. The capacitance between the capacitor electrodes 24 and 25 and the capacitance between the capacitor electrodes 27 and 25 define a parallel capacitance. By these two parallel capacitances, the capacitor Cio is provided.

The ground electrode 30 is connected to the ground electrodes 28 and 22 by the via-electrodes 42 and 44, and is further connected to the external connection ground electrode 13 by three via-electrodes 47.

Figure 4:
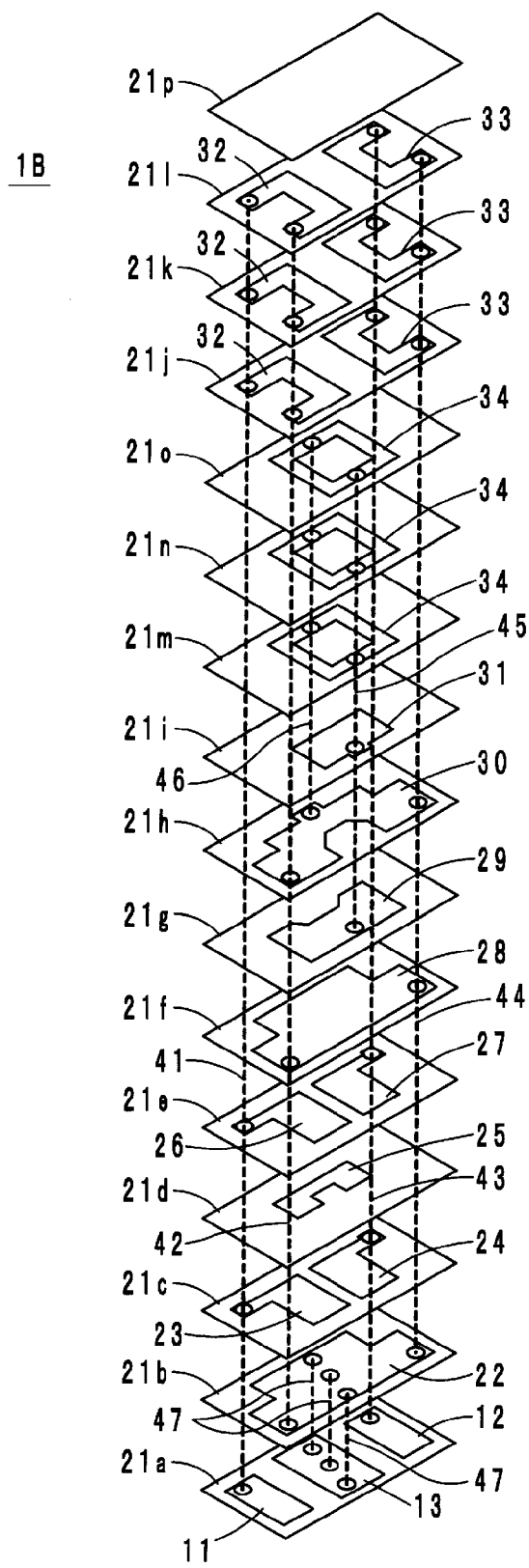
FIG. 4 is an exploded perspective view illustrating a second example of the multilayer structure of the band pass filter of the first preferred embodiment of the present invention.

FIG. 4 illustrates a second example of the multilayer structure of the band pass filter 1A. In the second example, dielectric layers 21m through 21o on which the line electrodes 34 defining the second LC parallel resonator LC2 are disposed are located between the dielectric layers 21i and 21j. The other portions of this structure are similar to those of the first example shown in FIG. 3.

Figure 5A:
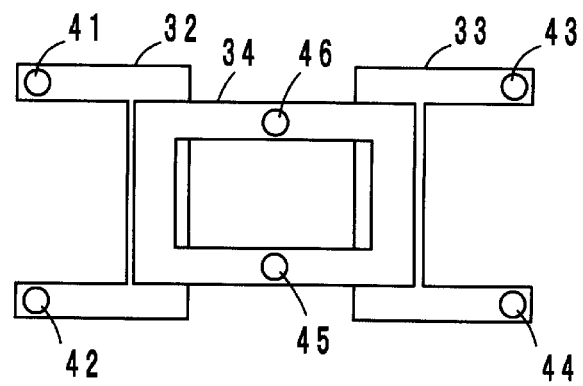
FIGS. 5A and 5B illustrate the states in which line electrodes overlap each other in the examples of the present invention.
Figure 9:
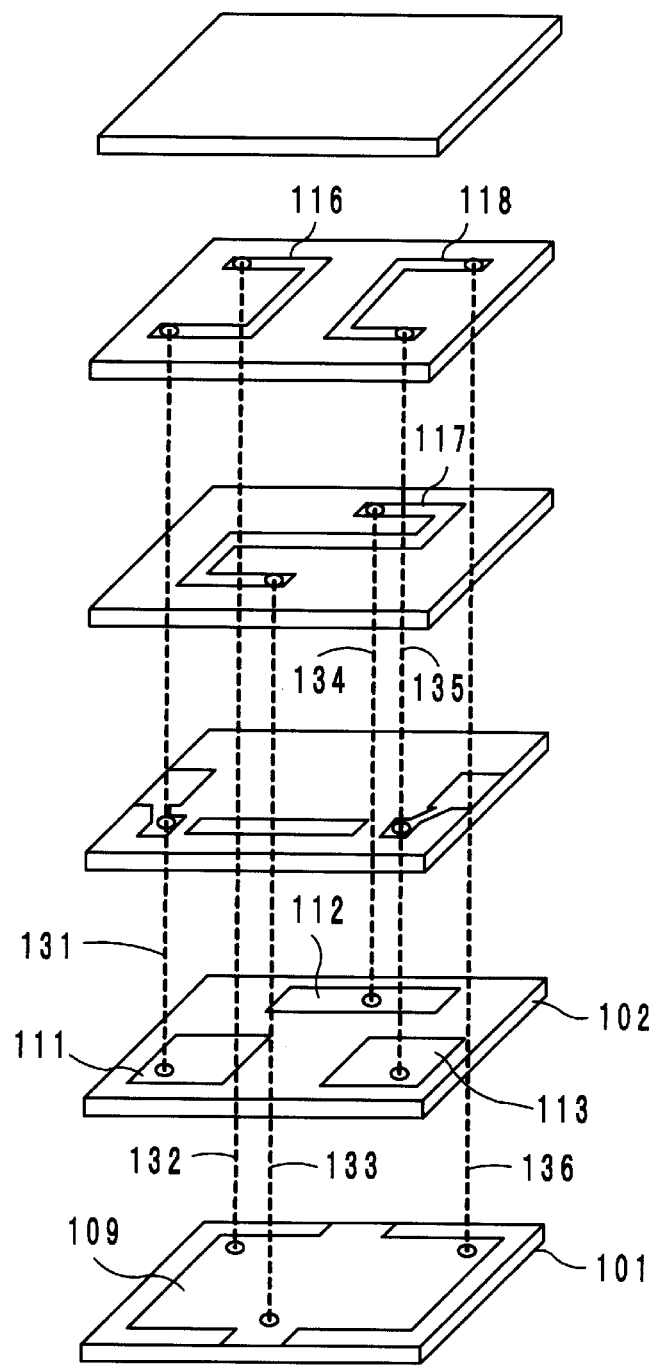
FIG. 9 is an exploded perspective view illustrating the multilayer structure of a known band pass filter.

The operation of the band pass filter 1A configured as described above is basically similar to that of the known band pass filter shown in FIG. 9. In this filter 1A, in the line electrodes 32 and 34 and the line electrodes 33 and 34 coupled with each other, the line electrodes 34 preferably have a quadrilateral ring-shaped configuration, as viewed in the stacking direction of the dielectric layers, as shown in FIG. 5A. The line electrode 117 preferably having a meander line shape of the known band pass filter shown in FIG. 5C includes sharp bending portions, which causes the concentration of a current. In contrast, in the line electrode 34 preferably has a closed ring-shaped configuration, such as a quadrilateral, because of this ring-shaped configuration, a current flows separately in the two portions, thus relaxing the concentration of a current. Thus, the Q factor of the resonator is improved.

Figure 7A:
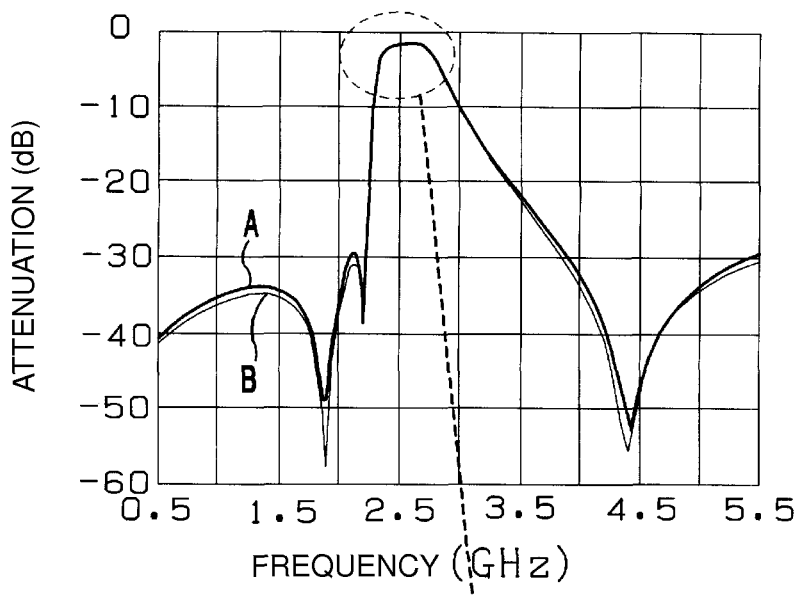
FIGS. 7A and 7B are graphs illustrating the attenuation characteristics of the band pass filter of the first preferred embodiment, together with the attenuation characteristics of a comparative example.
Figure 7B:
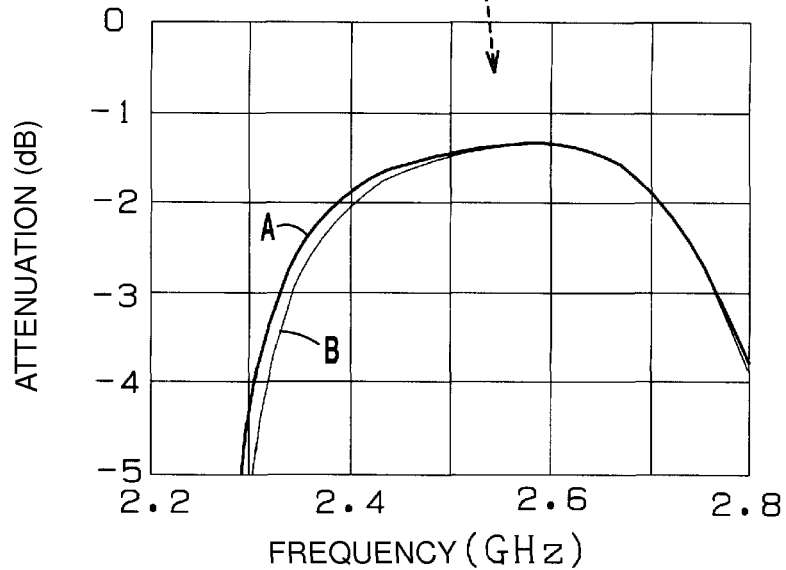
Figure 8:
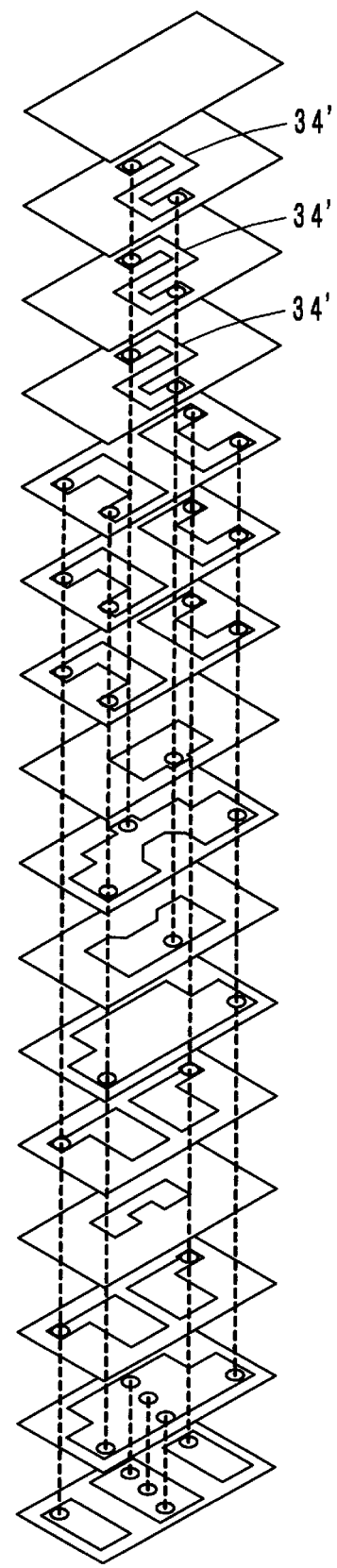
FIG. 8 is an exploded perspective view illustrating the multilayer structure of a band pass filter of a comparative example.

The attenuation characteristics of the band pass filter 1A having the multilayer structure shown in FIG. 3 are indicated by a curve A in FIG. 7A. FIG. 7A illustrates the attenuation characteristics in 0.5 GHz to 5.5 GHz, and FIG. 7B is an enlarged diagram of the attenuation characteristics in 2.2 GHz to 2.8 GHz, which is a portion of the attenuation characteristics shown in FIG. 7A. The curve B shown in FIG. 7A indicates the characteristics when line electrodes 34' have a meander line shape, as shown in FIG. 8, as in the known band pass filter. In FIG. 8, the configuration is the same as that shown in FIG. 3, except for the line electrodes 34'. Upon comparing the characteristics of the two structures (curves A and B), it is seen that, in the filter 1A, the attenuation characteristics in the pass band are improved, in particular, loss is reduced in the band of 2.3 GHz to 2.4 GHz due to the increased Q factor of the resonator.

Figure 5B:
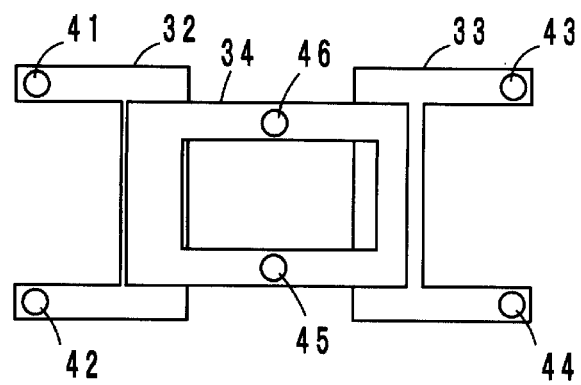
Figure 5C:
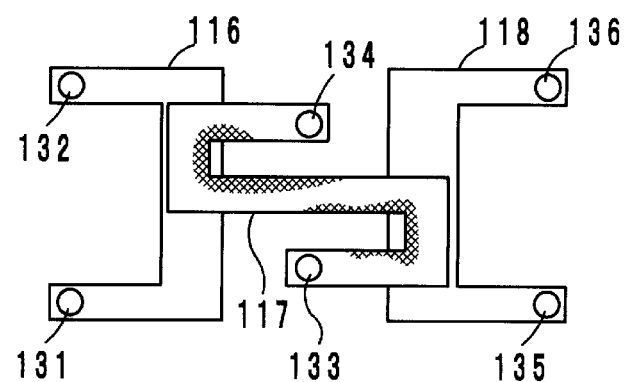
FIG. 5C illustrates the state in which line electrodes overlap each other in an example of a known band pass filter.

In the band pass filter 1A, the line electrodes 32, 33, 33, and 34 overlap each other, as viewed in the stacking direction, so as to increase the degree of coupling (inductive coupling) between the resonators. Thus, bandpass characteristics in which the pass band is wider with small insertion loss is obtained. As shown in FIG. 5B, the areas by which the line electrodes 32, 33, 33, and 34 overlap each other, as viewed from above, may be varied by changing the line widths of the line electrodes 32, 33, and 34 or by displacing the positions of the line electrodes 32, 33, and 34 on the plane if necessary, or by partially increasing or decreasing the widths of the line electrodes 32, 33, and 34. This makes it possible to adjust the degree of coupling between the resonators as desired.

The shape of the line electrodes 34, as viewed from above, is not restricted to a quadrilateral, and may be another shape as long as it has a ring-shaped configuration. In particular, if the line electrode 34 has a ring-shaped configuration, such as an elliptical shape shown in FIG. 6A or a circular shape shown in FIG. 6B, a current flows separately in the two portions because of this ring-shaped configuration of the line electrodes 34. Additionally, due to the absence of sharp bending portions in the elliptical or circular shape, the concentration of a current is further relaxed, thus making it possible to increase the Q factor. The shape of the line electrode 34 may be a polygon, such as that shown in FIG. 6C.

If a band pass filter includes three or more LC parallel resonators LC1 through LC5, such as the band pass filter 1B shown in FIG. 2, all of the resonators other than those of the input and output stages may have ring-shaped line electrodes. Alternatively, at least one of the intermediate-stage resonators may have ring-shaped line electrodes, and the line electrodes of the other resonators may be formed in a shape other than a ring-shaped configuration (for example, a meander line shape).

Alternatively, the line electrodes of the resonators of the input and output stages may also have a ring-shaped configuration.

Alternatively, the resonators of only the input and output stages or the resonator of only one of the input and output stages may have ring-shaped line electrodes.

Other Preferred Embodiments

The resonator and the band pass filter according to the present invention are not restricted to those discussed in the above-described preferred embodiments, and various modifications may be made within the spirit of the present invention.

For example, the patterns and arrangement of the capacitor electrodes, line electrodes, and ground electrodes may be different from those of the above-described preferred embodiments.

The number of resonators may be any number. In the first and second examples of the first preferred embodiment, three line electrodes with a meander line shape preferably are disposed on the layers higher than or lower than those of the three ring-shaped line electrodes. However, the ring-shaped line electrodes and the line electrodes having a meander line shape may be alternately disposed. In this case, an individual ring-shaped line electrode and an individual meander-line-shaped line electrode can be coupled with each other.

As described above, preferred embodiments of the present invention are preferably used in a resonator and a band pass filter and are particularly excellent in improving the Q factor of a resonator and in improving the attenuation characteristics of a band pass filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A band pass filter comprising:
a plurality of resonators, at least one of the plurality of resonators including:
a multilayer body including a plurality of dielectric layers;
an electrode being disposed on each of the plurality of dielectric layers;
a ground electrode disposed on one of the plurality of dielectric layers;
a capacitor electrode disposed on another one of the plurality of dielectric layers; and
an inductor electrode that extends from a first node between the inductor electrode and the capacitor electrode as a start point, passes through a line electrode disposed on a dielectric layer different from the dielectric layer on which the capacitor electrode is disposed and the dielectric layer on which the ground electrode is disposed, and reaches a second node between the inductor electrode and the ground electrode as an end point; wherein
the line electrode has a ring-shaped configuration, as viewed in a stacking direction of the plurality of dielectric layers; and
a first end of a first resonator of the plurality of resonators is connected to an input electrode and a second end of the first resonator of the plurality of resonators is connected to a ground, a first end of a second resonator of the plurality of resonators is connected to an output electrode and a second end of the second resonator of the plurality of resonators is connected to the ground, and a first end of a third resonator of the plurality of resonators is connected to the first resonator of the plurality of resonators via a first coupling capacitor and to the second resonator of the plurality of resonators via a second coupling capacitor and a second end of the third resonator of the plurality of resonators is connected to the ground.

2. The band pass filter according to claim 1, wherein
the plurality of resonators includes five or more resonators; and
at least one of the five or more resonators other than the first resonator and the second resonator includes the ring-shaped line electrode.

3. The band pass filter according to claim 1, wherein a third coupling capacitor is connected between the input electrode and the output electrode.

4. The band pass filter according to claim 1, wherein another line electrode defining a resonator different from the resonator including the ring-shaped line electrode opposes the ring-shaped line electrode in the stacking direction, and overlaps the ring-shaped line electrode, as viewed in the stacking direction.

5. The band pass filter according to claim 4, further comprising a plurality of pairs of line electrodes each including the line electrode and the another line electrode overlapping each other, wherein an area by which the line electrode and the another line electrode of one of the plurality of pairs of line electrodes overlap each other is different from an area by which the line electrode and the another line electrode of another of the plurality of pairs of line electrodes overlap each other.

6. The band pass filter according to claim 5, wherein
the plurality of resonators includes three or more resonators; and at least one of the three or more resonators other than the first resonator and the second resonator includes the ring-shaped line electrode.

7. The band pass filter according to claim 5, wherein the ring-shaped line electrode has one of a polygonal shape, a circular shape, and an elliptical shape.

8. The band pass filter according to claim 4, wherein
the plurality of resonators includes three or more resonators; and
at least one of the three or more resonators other than the first resonator and the second resonator includes the ring-shaped line electrode.

9. The band pass filter according to claim 4, wherein the ring-shaped line electrode has one of a polygonal shape, a circular shape, and an elliptical shape.

10. The band pass filter according to claim 1, wherein
the plurality of resonators includes three or more resonators; and
at least one of the three or more resonators other than the first resonator and the second resonator includes the ring-shaped line electrode.

11. The band pass filter according to claim 10, wherein the ring-shaped line electrode has one of a polygonal shape, a circular shape, and an elliptical shape.

12. The band pass filter according to claim 1, wherein the ring-shaped line electrode has one of a polygonal shape, a circular shape, and an elliptical shape.

* * * * *